United States Patent [19]
Brassington et al.

[11] Patent Number: 5,124,817
[45] Date of Patent: Jun. 23, 1992

[54] POLYSILICON EMITTER AND A POLYSILICON GATE USING THE SAME ETCH OF POLYSILICON ON A THIN GATE OXIDE

[75] Inventors: Michael P. Brassington; Reda R. Razouk, both of Sunnyvale; Monir H. El-Diwany, Santa Clara; Prateep Tuntasood, San Jose, all of Calif.

[73] Assignee: National Semiconductor Corporation, Santa Clara, Calif.

[21] Appl. No.: 694,744

[22] Filed: May 2, 1991

Related U.S. Application Data

[60] Division of Ser. No. 555,345, Jul. 19, 1990, which is a division of Ser. No. 418,946, Oct. 6, 1989, Pat. No. 5,001,081, which is a continuation of Ser. No. 145,076, Jan. 19, 1988, abandoned.

[51] Int. Cl.[5] ............... H01L 27/02; H01L 29/04; H01L 29/72
[52] U.S. Cl. .................................. 357/43; 357/41; 357/40; 357/59; 357/34; 357/35
[58] Field of Search .............. 357/43, 35, 41, 40, 357/59 H, 59 G, 34

[56] References Cited

U.S. PATENT DOCUMENTS

| | | | |
|---|---|---|---|
| 3,673,471 | 6/1972 | Klein et al. | 357/59 |
| 4,120,707 | 10/1978 | Beasom | 357/47 |
| 4,341,009 | 7/1982 | Bartholomew et al. | 357/91 |
| 4,346,512 | 8/1982 | Liang et al. | 357/43 |
| 4,497,106 | 2/1985 | Momma et al. | 357/43 |
| 4,503,603 | 3/1985 | Blossfeld | 357/43 |
| 4,717,686 | 1/1988 | Jacobs et al. | 357/43 |
| 4,727,046 | 2/1988 | Tuntasood et al. | 357/43 |
| 4,735,911 | 4/1988 | Schaber | 357/43 |
| 4,737,472 | 4/1988 | Schaber et al. | 357/43 |
| 4,745,080 | 5/1988 | Scovell et al. | 357/34 |
| 4,752,589 | 6/1988 | Schaber | 357/43 |
| 4,764,482 | 8/1988 | Hsu | 437/57 |

FOREIGN PATENT DOCUMENTS

| | | |
|---|---|---|
| 0196757 | 10/1986 | European Pat. Off. |
| 0219831 | 4/1987 | European Pat. Off. |
| 0239652 | 7/1987 | European Pat. Off. |
| 0232497 | 8/1987 | European Pat. Off. |

OTHER PUBLICATIONS

"Buried Contact Process," R. L. Mohler et al., *IBM Technical Disclosure Bulletin*, vol. 26, No. 7B (Dec. 1983).

*Primary Examiner*—William Mintel
*Assistant Examiner*—Wael Fahmy
*Attorney, Agent, or Firm*—Townsend & Townsend

[57] ABSTRACT

Bipolar and MOS devices are made simultaneously using a single fabrication process. In one embodiment of the invention, a silicon substrate is divided into bipolar and MOS regions. A thin layer of gate oxide, having a thickness in the range of from approximately 150 angstroms to 300 angstroms, is thermally grown on the silicon substrate. A thin layer of polycrystalline silicon, having a thickness in the range of from approximately 500 angstroms to 1000 angstroms is deposited on the gate oxide layer to protect the gate oxide layer during subsequent processing. Both the thin polysilicon layer and the gate oxide layer are removed from the bipolar region where the emitter is to be formed. To maintain the integrity of the gate oxide layer during etching, a photoresist mask used during the polysilicon etch is retained during the gate oxide etch, and the gate oxide is etched in a buffered oxide solution. A thick layer of polysilicon then is deposited on the bipolar and MOS regions of the silicon substrate, and the substrate is masked and etched for forming the emitter and gates of the bipolar and MOS devices, respectively.

2 Claims, 4 Drawing Sheets

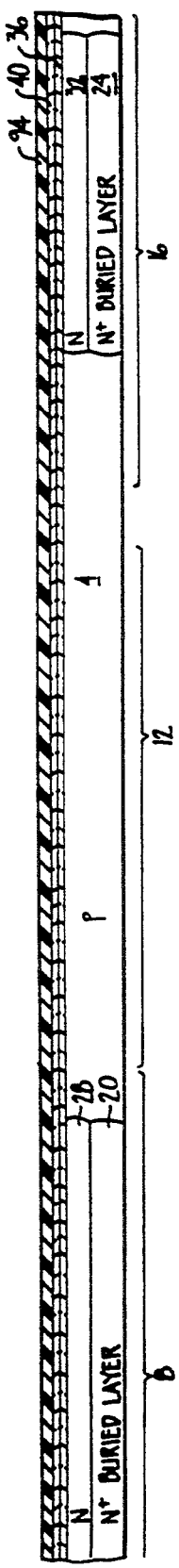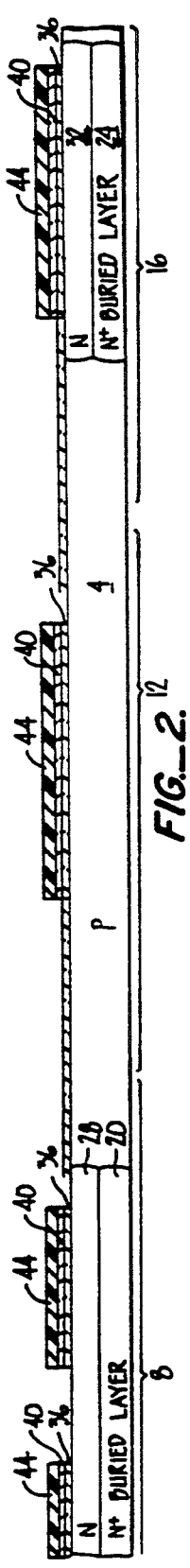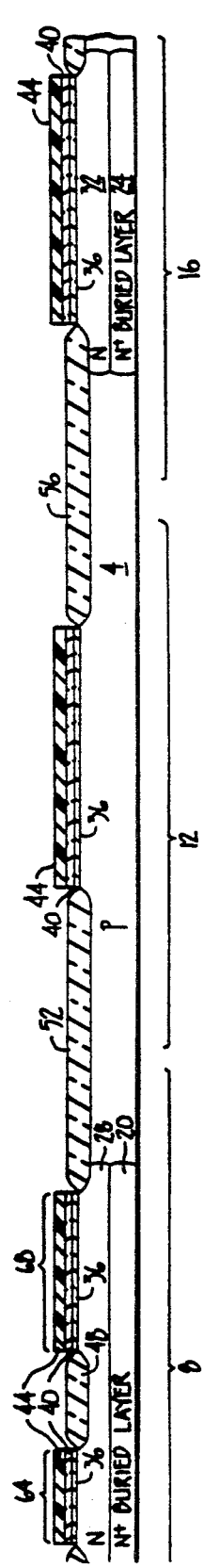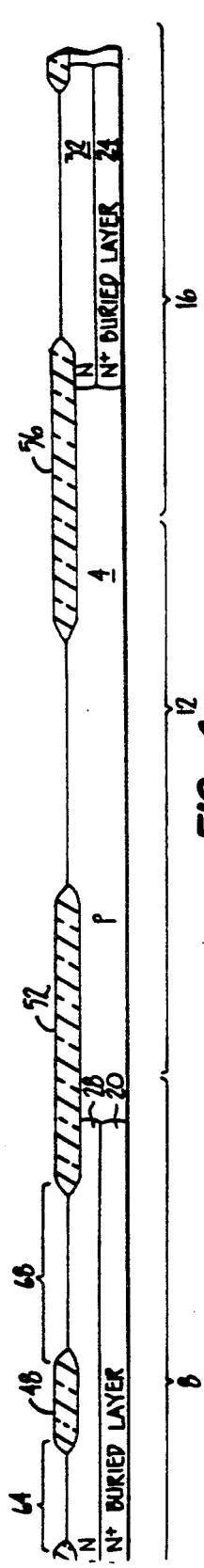

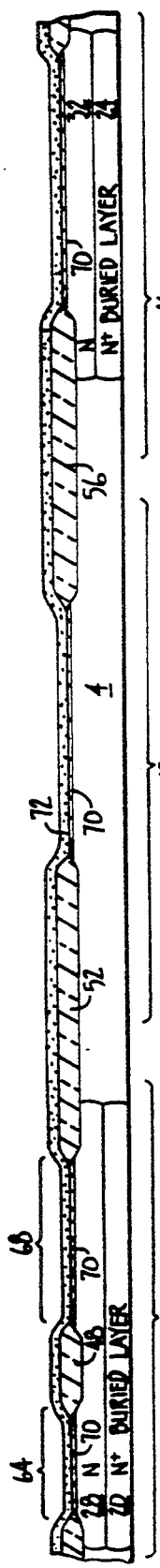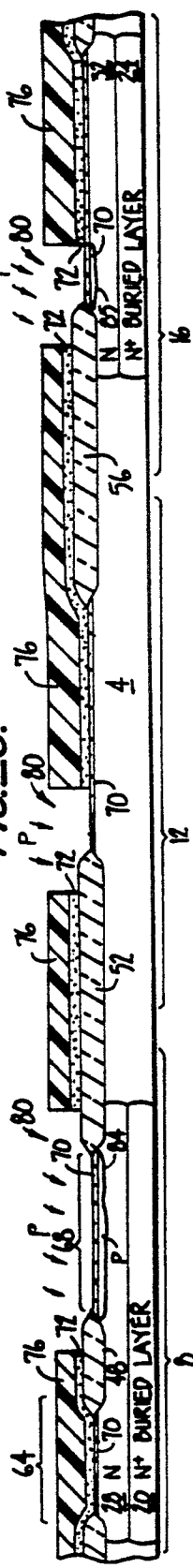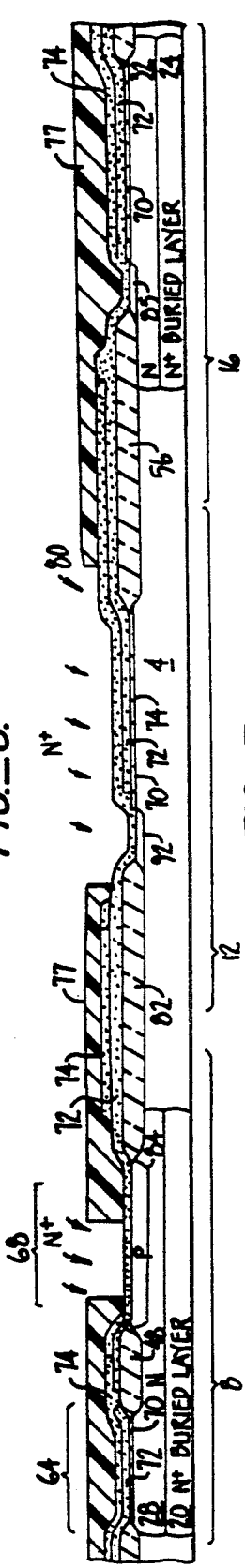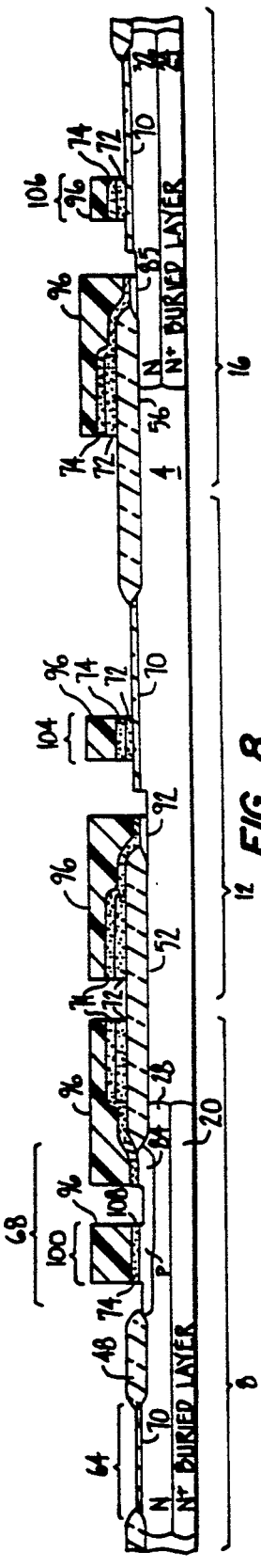

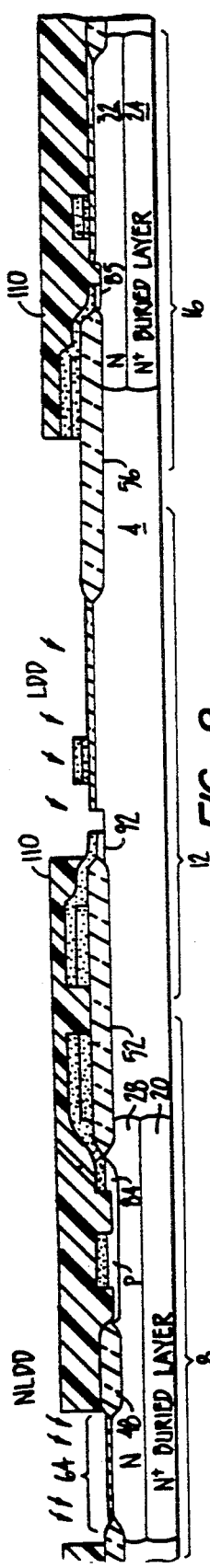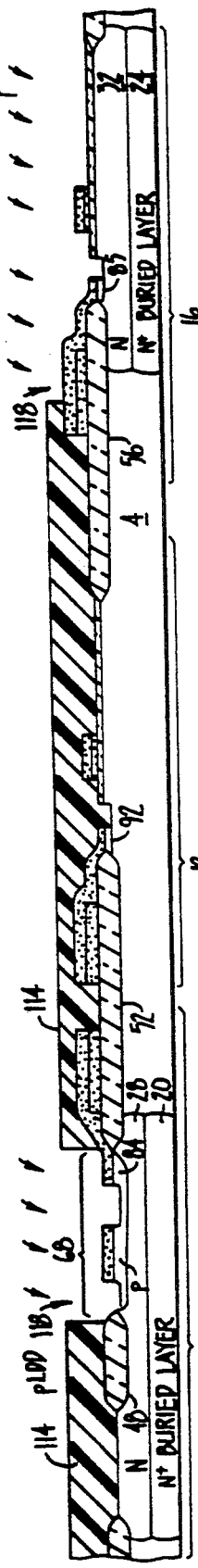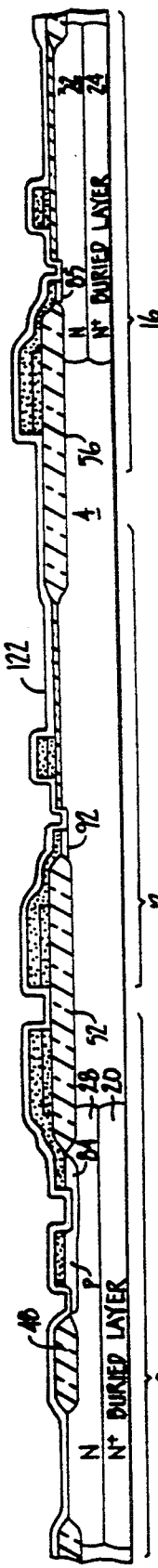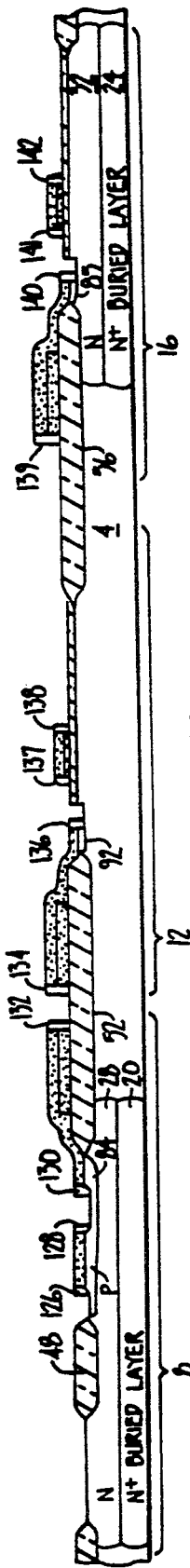

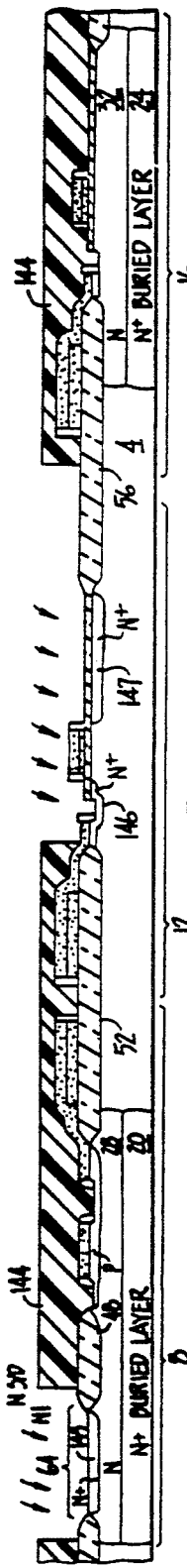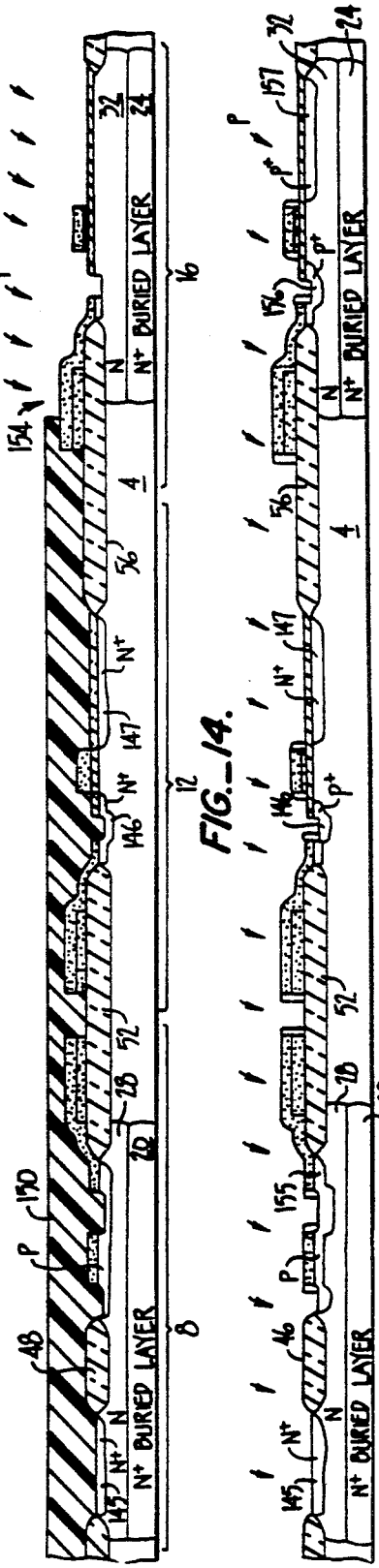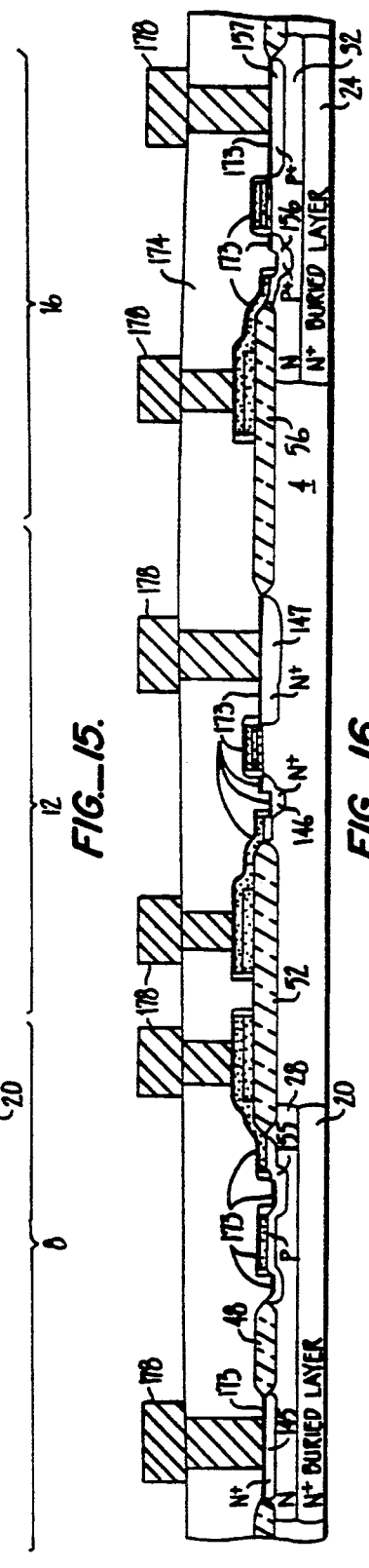

POLYSILICON EMITTER AND A POLYSILICON GATE USING THE SAME ETCH OF POLYSILICON ON A THIN GATE OXIDE

This is a division of copending application Ser. No. 07/555,345, filed Jul. 19, 1990, which is a division of application Ser. No. 07/418,946, now U.S. Pat. No. 5,001,081, filed Oct. 6, 1989, which is a continuation of application Ser. No. 07/145,076, filed Jan. 19, 1988, now abandoned.

BACKGROUND OF THE INVENTION

1. Field Of The Invention

This invention relates to semiconductor devices and, more particularly, to the simultaneous formation of bipolar and metal oxide semiconductor (MOS) devices on the same silicon substrate.

2. Description Of The Relevant Art

Methods for the fabrication of bipolar devices and MOS devices are known, Typically, bipolar devices are fabricated separately from MOS devices because of the structural differences between the two types of devices. This means that a circuit which uses both bipolar and MOS devices must be constructed using discrete chips, which increases the size and cost of the product.

If bipolar and MOS devices are to be combined, an integrated approach to device fabrication must be devised. However, applying the fabrication techniques used for one type of device to another type of device typically degrades the performance of the other device. For example, a common method for making electrical contact to a silicon substrate in a bipolar transistor involves the use of a layer of polysilicon deposited on the surface of the substrate. Electrical contact to the silicon substrate is made through this layer of polysilicon. The resulting structure is termed a "buried contact." However, the polysilicon/silicon interface layer increases the series resistance through the device. This is insignificant in bipolar devices, because the base of bipolar devices has small current flowing through it, and bipolar devices have intrinsically high resistances. However, the source and drain in MOS devices carry all of the current, so any increase in series resistance significantly affects performance of the devices. Series resistance can be improved by increasing the contact area, but with a resulting decrease in yield. Finally, the thin gate oxide layer used in MOS devices is subject to contamination and mechanical damage when subjected to bipolar fabrication methods.

SUMMARY OF THE INVENTION

The present invention is directed to a method of making bipolar and MOS devices simultaneously using a single fabrication process. The process according to the present invention employs the use of buried contacts without significantly affecting the performance of the MOS devices, and a very thin gate oxide layer may be used in the MOS devices without jeopardizing the integrity or performance of the devices.

In one embodiment of the present invention, a silicon substrate is divided into bipolar and MOS regions. A thin layer of gate oxide then is thermally grown on the silicon substrate. A thin layer of polysilicon is deposited on the gate oxide layer to protect the gate oxide layer during subsequent processing, and then both the thin polysilicon layer and the gate oxide layer are removed from the bipolar region where the emitter is to be formed. To maintain the integrity of the gate oxide layer, the photoresist mask used during the polysilicon etch is retained during the gate oxide etch, and the gate oxide is etched in a buffered oxide etch solution. A thick layer of polysilicon then is deposited on the bipolar and MOS regions of the silicon substrate, and the substrate is masked for forming the emitter and gates of the bipolar and MOS devices, respectively. After the emitter and gate locations are masked, the polysilicon is simultaneously etched from the bipolar and MOS regions for forming the respective emitter and gates. Since the polysilicon over the area where the emitter is formed is thinner than the polysilicon over the MOS region the silicon substrate surrounding the emitter is etched for forming the emitter island. The areas for the base and collector of the bipolar device and the source and drain of the MOS devices are selectively masked during etching of the polysilicon for providing buried contacts to these regions, if desired.

These and other features and advantages of the invention will become apparent to those skilled in the art upon a reading of the following detailed description of the invention, which should be taken in conjunction with the accompanying drawings.

BRIEF DESCRIPTION OF THE DRAWINGS

FIGS. 1-16 illustrate the steps of forming a combination bipolar/CMOS device according to the present invention.

DETAILED DESCRIPTION OF THE PREFERRED EMBODIMENTS

FIG. 1 shows a silicon substrate 4 after having undergone preliminary processing according to conventional methods. For example, silicon substrate 4 has been processed to form a bipolar region 8, an NMOS region 12, and a PMOS region 16. Bipolar region 8 is intended to be used for forming an NPN transistor, whereas NMOS region 12 is intended to be used for forming an N-channel MOS device and PMOS region 16 is intended to be used for forming a P-channel MOS device.

Silicon substrate 4 is formed of a P-type material. Consequently bipolar region 8 and PMOS region 16 have formed therein arsenic doped N+ buried layers 20 and 24, respectively. N+, buried layers 20 and 24 may be formed, for example, by the process disclosed in U.S. Pat. No. 3,648,125 to Douglas L. Peltzer, and assigned to Fairchild Camera and Instrument Corp. Formed above N+ buried layers 20 and 24 are N-wells 28 and 32, respectively, formed by diffusion of an appropriate N-type impurity such as phosphorous into substrate 4 according to well known techniques, N+ buried layers 20 and 24 typically have an impurity concentration of approximately $1 \times 10^{20}$ atoms/cm$^3$ and are approximately 1 $\mu$m thick, whereas N-wells 28 and 32 typically have an impurity concentration of approximately $1 \times 10^{16}$ atoms/cm$^3$ and a thickness of approximately 0.8 $\mu$m.

Disposed above substrate 4 are a layer of silicon dioxide 36 and a layer of silicon nitride 40. Silicon dioxide layer 36 preferably is thermally grown on the surface of substrate 4 by placing substrate 4 in an oxygen or steam, preferably steam, environment at a temperature of approximately 900° C. for 30 minutes. Silicon dioxide layer 36 has a thickness in the range of from approximately 350 angstroms to 450 angstroms, preferably 400 angstroms. Silicon nitride layer 40 may be deposited on top of silicon dioxide layer 36 by chemical vapor deposition (CVD). Silicon nitride layer 40 has a thickness in the range of from approximately 1500 angstroms to approximately 1700 angstroms, preferably 1600 angstroms.

Finally a layer of photoresist 44 is deposited on silicon nitride layer 40 through a blanket coating, preferably by spinning, to a thickness of approximately 1.5 $\mu$m. The photoresist layer 44 is subjected to a pattern exposure so that development of the photoresist produces portions of photoresist layer 44, as shown in FIG. 2. These remaining portions of photoresist layer 44 function as a mask to enable etching of the layer 40 of silicon nitride in the areas not protected by the remaining portions of photoresist layer 44. This etching preferably is a dry etch with a plasma, such as $SF_6$. This produces the structure illustrated in FIG. 2.

After silicon nitride layer 40 is etched, the remaining portions of photoresist layer 44 are removed by a solvent or oxygen plasma for example, and semi-recessed isolation oxide (SROX) regions 48, 52, and 56 are formed by thermal oxidation in the presence of dry oxygen or steam. Preferably, the SROX regions 48, 52, and 56 are formed by thermal oxidation in steam at a temperature of 900° C. to a thickness of from approximately 5000 angstroms to approximately 6000 angstroms, preferably 5500 angstroms. As a result, bipolar region 8 is electrically isolated from NMOS region 12 by SROX region 52, and NMOS region 12 is electrically isolated from PMOS region 16 by SROX region 56, SROX region 48 separates bipolar region 8 into a collector region 64 and a base/emitter region 68.

After formation of the SROX regions 48, 52, and 56, the remaining portions of silicon nitride layer 40 and silicon dioxide layer 36 are removed to produce the structure shown in FIG. 4. The portions of silicon nitride layer 40 may be removed by wet etching in orthophosphoric acid, and silicon dioxide layer 36 may be removed by wet etching in hydroflouric acid.

As shown in FIG. 5, the next step is to form a thin layer of silicon dioxide 70 on the exposed surfaces of substrate 4. Silicon dioxide layer 70 preferably is grown in the same manner as silicon dioxide layer 36, and it has a thickness in the range of from approximately 150 angstroms to 300 angstroms, preferably 170 angstroms, This range has been found by experimentation to be critical in order to avoid contamination and mechanical damage during subsequent processing. Next, a thin polycrystalline silicon layer 72 is deposited as a blanket coating over the silicon dioxide layer 70 and the SROX regions 48, 52, and 56, The polycrystalline silicon layer 72 is deposited by CVD, and it has a thickness of from approximately 500 angstroms to 1000 angstroms, preferably 700 angstroms. This thickness of polycrystalline silicon layer 72 has been found by experimentation to be critical to protect silicon dioxide layer 70 during subsequent processing.

Next, as shown in FIG. 6 a photoresist layer 76 is deposited as a blanket coating over polycrystalline silicon layer 72 in the same manner as photoresist layer 44, After photoresist layer 76 is deposited and developed, openings 80 are formed over base/emitter region 68 and over those regions where buried contacts to the silicon substrate are desired. Two such regions are shown. With the remaining portions of photoresist layer 76 functioning as a mask, the exposed sections of polycrystalline silicon layer 72 are removed by a dry etch. The dry etch may be performed with a plasma, such as $SF_6$. Then, the exposed portions of gate oxide layer 70 are ion-implanted with a P-type impurity, preferably boron, with an energy of 40 KeV to a concentration of approximately $1 \times 10^{18}$ atoms/$cm^3$. This P-type implant forms the initial base region 84 in N-well 28 of bipolar region 8 and the source contact region 85 in PMOS region 16. On the other hand, the P-type implant has a negligible effect on the P-type substrate beneath the exposed region in NMOS region 12.

Next, as shown in FIG. 7, the exposed portions of gate oxide layer 70 are removed through a buffered oxide etch while maintaining photoresist layer 76 as a mask. Photoresist layer 76 then is removed, and a relatively thick polycrystalline silicon layer 74 is deposited as a blanket coating by CVD over the remaining portions of polycrystalline silicon layer 72 and the exposed areas of silicon substrate 4. Polycrystalline silicon layer 74 is substantially thicker than polycrystalline silicon layer 72, and preferably has a thickness of from approximately 2200 angstroms to 2800 angstroms. preferably 2500 angstroms. Next, a layer of photoresist 77 is deposited and developed to form openings 88 over base/emitter region 68 where an emitter is to be formed, and over NMOS region 12, Polycrystalline silicon layers 72 and 74 then are doped by ion implantation to reduce their resistivity. Preferably, an N-type impurity, such as arsenic, is used, and the ions are implanted with an energy of 80 KeV to a concentration of from approximately $1 \times 10^{15}$ to $1 \times 10^{16}$ atoms/$cm^3$. This is to make the conductivity of the exposed polysilicon layers as high as possible to function as a conductor. The remaining portions of photoresist layer 77 are removed, and the structure is then annealed at a temperature of from approximately 900° C. to 950° C. for approximately 30 minutes in a nitrogen atmosphere. This causes diffusion to expand the initial base region 84 and P+ region 85 and to form N+ region 92.

Next, a shown in FIG. 8, a photoresist layer 96 is deposited over polysilicon layer 74. Photoresist layer 96 is developed to expose all areas of polysilicon layer 74, except over a region 100 which will form the emitter of the bipolar device, over a region 104 which will form the gate of the NMOS device, over a region 106 which will form the gate of the PMOS device, and over the regions of polysilicon layer 74 where buried contacts to the silicon substrate are to be made. e.g., over SROX region 52. The exposed portions of polysilicon layer 74 then are etched by a plasma, such as $SF_6$, until the exposed portions of polysilicon are removed. Since some areas of polysilicon comprise polysilicon layers 72 and 74, whereas other areas of polysilicon comprise only polysilicon layer 74, portions of substrate 4 not protected by gate oxide layer 70 are etched to a depth approximately equal to that of the polysilicon layer 72, This occurs in base/emitter region 68 and forms an emitter island 108. Consequently, the thickness of polysilicon layers 72 and 74 in regions 104 and 106, which form the NMOS and PMOS gates, is the same as the depth of polysilicon layer 74 and emitter island 108 in region 100.

Next, as shown in FIG. 9, photoresist layer 96 is removed and a photoresist layer 110 is deposited over substrate 4 everywhere except collector region 64 of bipolar region 8 and NMOS region 12. Then, a lightly doped drain (LDD) implant is performed with phosphorous ions on the exposed regions at an implantation energy of 40 KeV to a concentration of from approximately $1 \times 10^{13}$ to $1 \times 10^{14}$ atoms/$cm^3$.

Next, as shown in FIG. 10, photoresist layer 110 is removed and a photoresist layer 114 is deposited over substrate 4, Photoresist layer 114 then is developed to form openings 118 over base/emitter region 68 and PMOS region 16. Then, a P-type LDD implant is performed, preferably with boron difluoride at an implantation energy of 50 KeV to a concentration of from approximately $1 \times 10^{13}$ to $1 \times 10^{14}$, preferably $5 \times 10^{13}$ atoms/cm$^3$. Thereafter, photoresist layer 114 is removed.

Next, as shown in FIG. 11 a conformal silicon dioxide layer is deposited by CVD over the entire surface of substrate 4 to a thickness of from approximately 1500 to 4000 angstroms, preferably 2000 angstroms. Silicon dioxide layer 122 then is subjected to an LTO densification by heating at approximately 900° C. for approximately 15 minutes.

Then, as shown in FIG. 12 silicon dioxide layer 122 is subjected to an anisotropic etch, preferably in a plasma comprising He.C$_2$F$_6$.CHF$_3$ to form spacers 126, 128, 130, 132, 134, 136, 137, 138, 139, 140, 141. and 142.

In the next step, shown in FIG. 13, a photo-resist mask 144, similar to photoresist mask 110, is deposited and developed to expose collector region 64 and NMOS region 12. An N-type ion implant then is performed, preferably with arsenic, at an implantation energy of 100 KeV to a concentration of approximately $5 \times 10^{15}$ atoms/cm$^3$ for forming the source and drain regions of the NMOS device and the collector of the bipolar device, Afterwards, substrate 4 is annealed at a temperature of 900° C., for approximately 30 minutes to form N+ collector 145, in bipolar region 8, and N+ source 146 (which merges with N+ region 92) and N+ drain 147 in NMOS region 12.

Similarly as shown in FIG. 14, a photoresist layer 150 is deposited and developed to form an opening 154 over PMOS region 16, and then a P-type ion implant is performed with boron difluoride at an implantation energy of 50 KeV to a concentration of approximately $3 \times 10^{15}$ atoms/cm$^3$ for creating the source and drain of the PMOS device. Then, as shown in FIG. 15, photoresist layer 150 is removed and a final blanket, unmasked P-type implant with BF$_2$ at an implantation energy of 50 KeV to a concentration of $1 \times 10^{14}$ atoms/cm$^3$ is performed for forming the extrinsic base of the bipolar device. Substrate 4 then is annealed at a temperature of 900° for approximately 40 minutes to form base 155 (which merges with region 84), in bipolar region 8, and P+ source 156 (which merges with P+ region 85) and P+ drain 157 in PMOS region 16.

Finally, as shown in FIG. 16, the exposed silicon and polysilicon regions are silicided using well known techniques to form silicide layers 173. The substrate 4 is covered with a planarizing layer 174 of deposited oxide using well known techniques, such as LTO, Planarizing layer 174 then is etched, and metal contacts 178 are made to the conductive regions also using well known techniques.

While the above is a complete description of a preferred embodiment of the present invention, various modifications may be employed, For example, techniques may be used to construct a single MOS device without the bipolar devices, and the base, collector, and emitter of bipolar devices formed and the source, drain, and gate of MOS devices formed may be selectively electrically contacted with buried contacts as desired. Consequently, the scope of the invention should not be limited, except as properly described in the claims.

What is claimed is:

1. A semiconductor device formed in a single silicon substrate comprising:

a bipolar transistor, including:
   a collector region formed of a semiconductor material having a first conductivity type;
   a base region contacting the collector region, the base region being formed of a semiconductor material having a conductivity type opposite the conductivity type of the semiconductor material forming the collector region; and
   a first polycrystalline silicon layer having a thickness of from approximately 2200 to 2800 angstroms contacting the base region for forming an emitter, the first polycrystalline silicon layer being doped with an impurity having the same conductivity type as the semiconductor material forming the collector region;

a MOS transistor, including:
   a source region formed of a semiconductor material having a first conductivity type;
   a drain region formed of a semiconductor material having the same conductivity type as the semiconductor material forming the source region, the drain region being spaced apart from the source region;
   a gate oxide layer having a thickness of from approximately 150 to 300 angstroms disposed over the silicon substrate between the source region and the gate region;
   a second polycrystalline silicon layer having a thickness of from approximately 2700 to 3800 angstroms disposed over the gate oxide layer for forming a gate electrode, the second polycrystalline silicon layer being doped with an impurity having a conductivity type opposite the conductivity type of the semiconductor material forming the source and drain regions;
   a buried contact formed by a third polycrystalline silicon layer having a thickness of from approximately 500 to 1000 angstroms contacting one of the source region and drain region;
   a nonconductive oxide spacer disposed on a sidewall of the third polycrystalline silicon layer contacting the source or drain region, the spacer extending from the third polycrystalline silicon layer and forming a generally vertical sidewall; and
wherein a portion of the substrate beneath the spacer is etched lower than a portion of the substrate beneath the third polycrystalline silicon layer by a depth approximately equal to the depth of the third polysilicon layer.

2. The semiconductor device according to claim 1 wherein a portion of the substrate adjacent to the emitter is etched lower than a portion of the substrate beneath the emitter by a depth approximately equal to the depth of the third polysilicon layer.

* * * * *